(12) United States Patent
Chen et al.

(10) Patent No.: US 9,966,366 B2
(45) Date of Patent: May 8, 2018

(54) LIGHTING DEVICE

(71) Applicant: EPISTAR CORPORATION, Hsinchu (TW)

(72) Inventors: Kuan-Chun Chen, Taichung (TW); Hao-Chung Kuo, Hsin-Tsu County (TW); You-Da Lin, Youlin County (TW); Zhen-Yu Li, Chiayi County (TW)

(73) Assignee: EPISTAR CORPORATION, Hsinchu (TW)

( * ) Notice: Subject to any disclaimer, the term of this patent is extended or adjusted under 35 U.S.C. 154(b) by 0 days. days.

(21) Appl. No.: 15/250,044

(22) Filed: Aug. 29, 2016

(65) Prior Publication Data

US 2016/0365337 A1    Dec. 15, 2016

Related U.S. Application Data

(63) Continuation of application No. 14/791,997, filed on Jul. 6, 2015, now Pat. No. 9,431,576, which is a
(Continued)

(51) Int. Cl.
*H01L 25/075* (2006.01)
*H01L 33/64* (2010.01)
(Continued)

(52) U.S. Cl.
CPC .......... *H01L 25/0753* (2013.01); *F21V 21/00* (2013.01); *H01L 27/156* (2013.01); *H01L 33/0079* (2013.01); *H01L 33/06* (2013.01);

*H01L 33/20* (2013.01); *H01L 33/24* (2013.01); *H01L 33/32* (2013.01); *H01L 33/36* (2013.01);
(Continued)

(58) Field of Classification Search
CPC .... F21S 6/00; F21V 3/049; F21V 7/22; F21V 21/00; F21V 29/74; F21V 29/89; F21Y 2101/00; F21Y 2105/10; F21Y 2115/10; H01L 25/0753; H01L 24/186; H01L 33/06; H01L 33/20; H01L 33/24; H01L 33/32; H01L 33/36; H01L 33/62; H01L 33/64; H01L 33/0079; H01L 33/502; H01L 33/642; H01L 33/647; H01L 2924/0002; H01L 27/156
See application file for complete search history.

(56) References Cited

U.S. PATENT DOCUMENTS 8,604,491 B2    12/2013    Yu et al.
8,735,911 B2    5/2014    Sakai et al.
(Continued)

FOREIGN PATENT DOCUMENTS

EP          1 482 566 A2    12/2004
WO    WO 2006/038713 A1    4/2006

*Primary Examiner* — Stephen F Husar
(74) *Attorney, Agent, or Firm* — Muncy, Geissler, Olds & Lowe, P.C.

(57) ABSTRACT

A lighting device includes a plurality of light-emitting diodes including a first light-emitting diode with a non-rectangular shape in a top view, a submount to which each of the plurality of light-emitting diodes is coupled, and a plurality of conductive elements formed between the submount and the plurality of light-emitting diodes to electrically connecting at least a portion of the plurality of light-emitting diodes with each other in series.

20 Claims, 12 Drawing Sheets

Related U.S. Application Data continuation of application No. 13/790,092, filed on Mar. 8, 2013, now Pat. No. 9,076,950.

(60) Provisional application No. 61/701,178, filed on Sep. 14, 2012.

(51) Int. Cl.

| | | |
|---|---|---|
| *F21V 21/00* | (2006.01) | |
| *H01L 27/15* | (2006.01) | |
| *H01L 33/24* | (2010.01) | |
| *H01L 33/36* | (2010.01) | |
| *H01L 33/50* | (2010.01) | |
| *H01L 33/62* | (2010.01) | |
| *H01L 33/00* | (2010.01) | |
| *H01L 33/06* | (2010.01) | |
| *H01L 33/20* | (2010.01) | |
| *H01L 33/32* | (2010.01) | |
| *F21S 6/00* | (2006.01) | |
| *F21V 3/04* | (2018.01) | |
| *F21V 7/22* | (2018.01) | |
| *F21V 29/74* | (2015.01) | |
| *F21V 29/89* | (2015.01) | |
| *F21Y 101/00* | (2016.01) | |
| *F21Y 105/10* | (2016.01) | |
| *F21Y 115/10* | (2016.01) | |

(52) U.S. Cl.
CPC ............ *H01L 33/502* (2013.01); *H01L 33/62* (2013.01); *H01L 33/64* (2013.01); *H01L 33/647* (2013.01); *F21S 6/00* (2013.01); *F21V 3/049* (2013.01); *F21V 7/22* (2013.01); *F21V 29/74* (2015.01); *F21V 29/89* (2015.01); *F21Y 2101/00* (2013.01); *F21Y 2105/10* (2016.08); *F21Y 2115/10* (2016.08); *H01L 33/642* (2013.01); *H01L 2924/0002* (2013.01)

(56) References Cited

U.S. PATENT DOCUMENTS

| | | | |
|---|---|---|---|
| 8,865,489 B2 | 10/2014 | Rogers et al. | |
| 9,076,950 B2 | 7/2015 | Chen | |
| 9,431,576 B2 * | 8/2016 | Chen ................... | H01L 25/0753 |
| 2006/0255352 A1 | 11/2006 | Lin et al. | |
| 2007/0023769 A1 | 2/2007 | Nishimoto et al. | |
| 2012/0161196 A1* | 6/2012 | Lowenthal ............ | H01L 25/048 257/100 |

* cited by examiner

LIGHTING DEVICE

RELATED APPLICATION

This application is a continuation application of U.S. patent application Ser. No. 14/791,997, filed on Jul. 6, 2015, now U.S. Pat. No. 9,431,576, which is a continuation of U.S. patent application Ser. No. 13/790,092, filed on Mar. 8, 2013, now U.S. Pat. No. 9,076,950, which is a Utility patent application of provisional U.S. Patent Application No. 61/701,198, filed on Sep. 14, 2012, entitled "High Voltage LED with Improved Heat Dissipation and Light Extraction", the content of which are incorporated herein by reference in their entirety.

TECHNICAL FIELD

The present disclosure relates generally to lighting device, and more particularly to a high voltage light-emitting diode (LED) with improved heat dissipation, more efficient light extraction, and better electrical connection.

DESCRIPTION OF THE RELATED ART

LEDs are semiconductor photonic devices that emit light when a voltage is applied. LEDs have increasingly gained popularity due to favorable characteristics such as small device size, long lifetime, efficient energy consumption, and good durability and reliability. In recent years, LEDs have been deployed in various applications, including indicators, light sensors, traffic lights, broadband data transmission, back light unit for LCD displays, and other suitable illumination apparatuses. For example, LEDs are often used in illumination apparatuses provided to replace conventional incandescent light bulbs, such as those used in a typical lamp.

However, existing LEDs still have drawbacks. For example, conventional high voltage LEDs may be configured to handle a high voltage (e.g., a few hundred volts), but they may suffer from problems such as poor heat dissipation and frequency electrical failures. A conventional flip chip LEDs may have better heat dissipation than the conventional high voltage LEDs, but conventional flip chip LEDs cannot handle high voltages and have poor light extraction efficiency. And in addition to some of these problems discussed above, other types of LEDs may also require difficult dicing processes.

Therefore, although existing LEDs have been generally adequate for their intended purposes, they have not been entirely satisfactory in every aspect. High voltage LEDs with better heat dissipation, more efficient light extraction, and more robust electrical connections continue to be sought.

SUMMARY OF THE DISCLOSURE

A lighting device includes a plurality of light-emitting diodes including a first light-emitting diode with a non-rectangular shape in a top view, a submount to which each of the plurality of light-emitting diodes is coupled, and a plurality of conductive elements formed between the submount and the plurality of light-emitting diodes to electrically connecting at least a portion of the plurality of light-emitting diodes with each other in series.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION OF THE EMBODIMENTS

Figure 1:
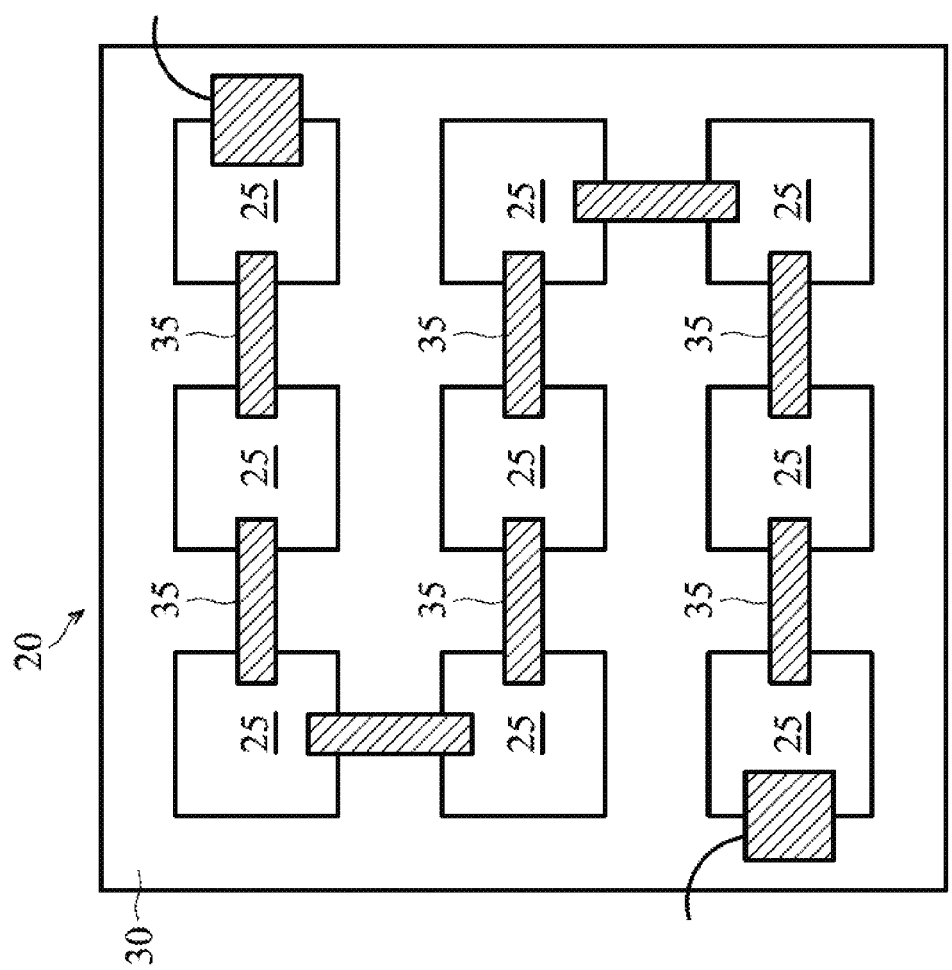
FIG. 1 is a diagrammatic top view of a high voltage LED.

It is understood that the following disclosure provides many different embodiments, or examples, for implementing different features of various embodiments. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. Moreover, the terms "top," "bottom," "under," "over," and the like are used for convenience and are not meant to limit the scope of embodiments to any particular orientation. Various features may also be arbitrarily drawn in different scales for the sake of simplicity and clarity. In addition, the present disclosure may repeat reference numerals and/or letters in the various examples. This repetition is for the purpose of simplicity and clarity and does not in itself necessarily dictate a relationship between the various embodiments and/or configurations discussed.

Semiconductor devices can be used to make photonic devices, such as light-emitting diodes (LEDs). When turned on, LEDs may emit radiation such as different colors of light in a visible spectrum, as well as radiation with ultraviolet or infrared wavelengths. Compared to traditional light sources (e.g., incandescent light bulbs), lighting instruments using LEDs as light sources offer advantages such as smaller size, lower energy consumption, longer lifetime, variety of available colors, and greater durability and reliability. These advantages, as well as advancements in LED fabrication technologies that have made LEDs cheaper and more robust, have added to the growing popularity of LED-based lighting instruments in recent years.

However, existing LEDs still have drawbacks. For example, referring to FIG. 1, a top view of a high voltage LED (HVLED) die 20 is illustrated. The HVLED die 20 includes a plurality of LEDs 25 disposed on a sapphire substrate 30. The HVLED die 20 is configured to handle high voltages, for example voltages over 12 volts. The HVLED die 20 accomplishes this by electrically coupling the plurality of LEDs 25 together in series (for example by electrical conductors 35), so that a high voltage can be spread out and be borne by each of the LEDs. However, the HVLED die 20 has poor heat dissipation. The thermal conduction path is from the LEDs 25 down to the sapphire substrate 30 below. The sapphire substrate is a poor heat conductor and is usually quite thick, for example 100 to 200 microns (um). As a result of the poor thermal conductivity and the relatively long thermal conduction path, the HVLED die may be prone to overheating. In addition, the electrical coupling by way of the electrical conductors 35 is not very robust. The electrical conductors 35 may break off easily, and a single break may render the entire die 20 defective, since all the LEDs 25 are coupled in series.

A flip chip LED may have better heat dissipation characteristics than the HVLED 20 discussed above. However, such flip chip LEDs may have other drawbacks. One drawback is that they tend to have bad light extraction efficiency due to current crowding issues. Another drawback of the flip chip LEDs is the difficulty in implementing the electrical connections for them.

According to embodiments of the present disclosure, an improved HVLED lighting apparatus is disclosed that offers good heat dissipation, improved light extraction efficiency, as well as a robust and easy to implement electrical coupling scheme. The processes used to fabricate such HVLED according to some embodiments are discussed below with reference to FIGS. 1-9, which have been simplified for the present disclosure.

Figure 2:
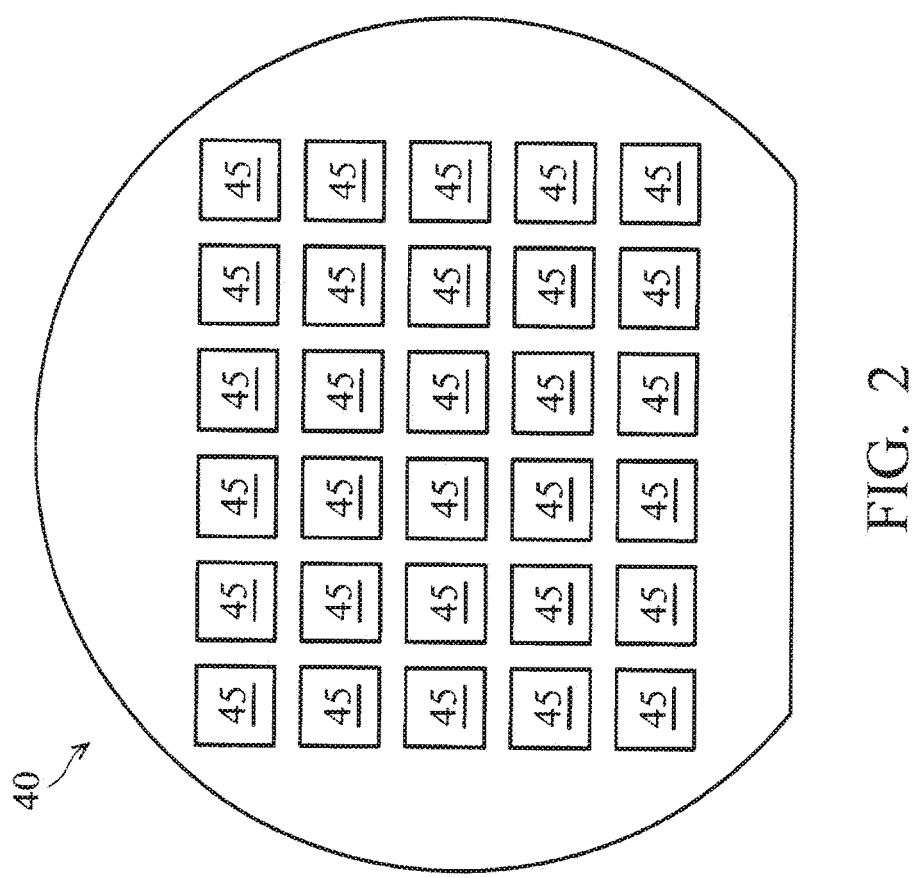
FIG. 2 is a top view of a wafer containing a plurality of dies according to various aspects of the present disclosure.

Referring now to FIG. 2, a top view (or a planar view) of a wafer 40 is illustrated. In some embodiments, the wafer 40 includes a sapphire material suitable for epitaxially growing a III-V compound material thereon. A III-V compound contains an element from a "III" group (or family) of the periodic table, and another element from a "V" group (or family) of the periodic table. For example, the III group elements may include Boron, Aluminum, Gallium, Indium, and Titanium, and the V group elements may include Nitrogen, Phosphorous, Arsenic, Antimony, and Bismuth.

The wafer 40 includes a plurality of dies 45 (or die areas, since the III-V compound epi-layers have not been grown on the wafer 40 at the stage of fabrication shown in FIG. 2). The dies 45 are shown for the sake of providing an example, and the actual shapes and sizes of the dies 45 may vary. For example, although a rectangular shape (in a top view) is shown for the dies 45, the dies 45 may actually have other polygonal shapes in various embodiments, for example a triangular shape or a hexagonal shape. According to various aspects of the present disclosure, a plurality of LEDs will be formed on each die 45. For reasons of simplicity, FIGS. 3-7 illustrate simplified cross-sectional side views of a single die 45 at various stages of fabrication. It is understood that other dies 45 may undergo the same fabrication processes.

Figure 3:
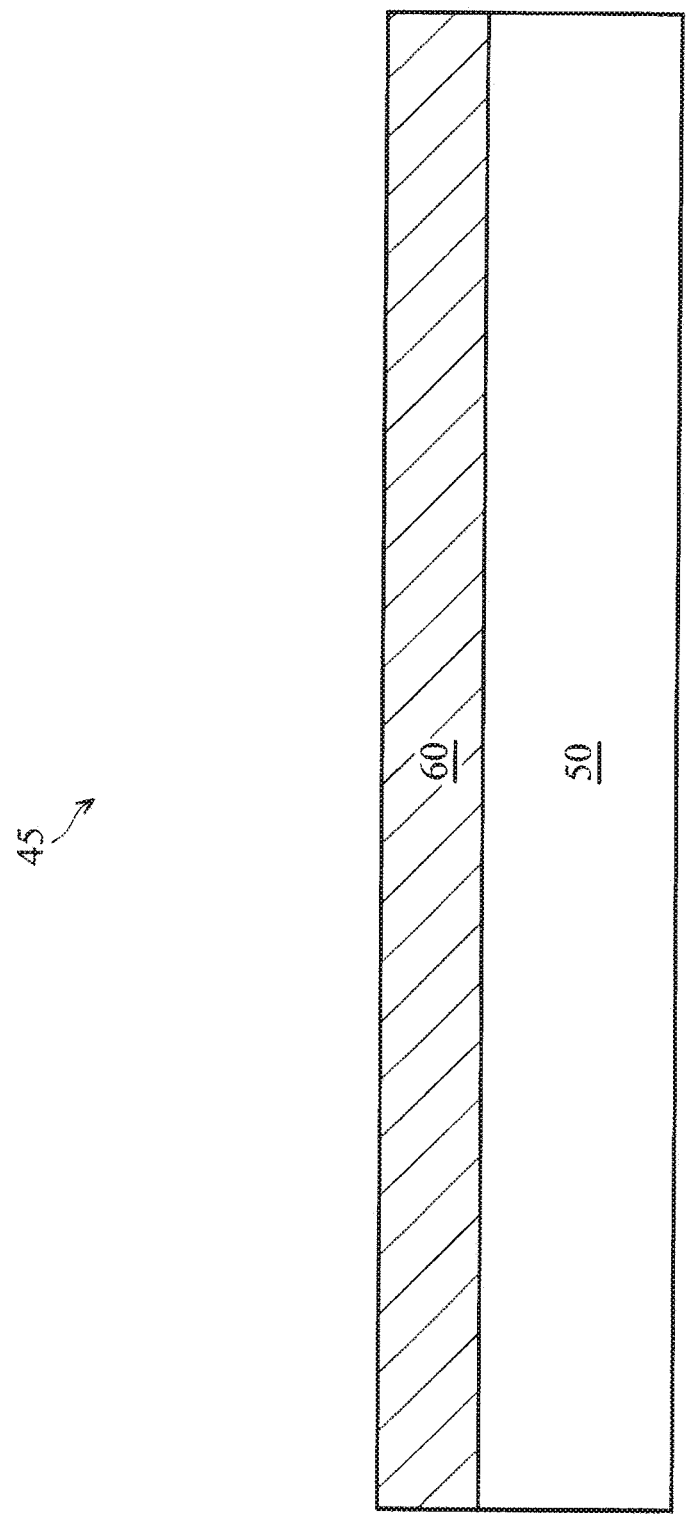
FIGS. 3-7 are diagrammatic fragmentary cross cross-sectional side views of a die containing a plurality of LEDs according to various aspects of the present disclosure.

Referring now to FIG. 3, the die 45 includes a growth substrate 50. As discussed above, the growth substrate 50 may include a sapphire material that is suitable for epitaxially growing III-V compounds such as gallium nitride. The substrate 50 may have a thickness that is in a range from about 50 um to about 1000 um. In some embodiments, a low temperature buffer film may be formed over the substrate 50. For reasons of simplicity, however, the low temperature buffer film is not illustrated herein.

A plurality of epi-layers 60 are then grown over the growth substrate 50 in one or more epitaxial processes. The various layers of the epi-layers 60 are now discussed below.

The epi-layers 60 may include an undoped semiconductor layer formed over the substrate 50. The undoped semiconductor layer is free of a p-type dopant or an n-type dopant. In some embodiments, the undoped semiconductor layer includes a compound that contains an element from the "III" group (or family) of the periodic table, and another element from the "V" group (or family) of the periodic table, for example an undoped gallium nitride (GaN) material. The undoped semiconductor layer can serve as a buffer layer (for example, to reduce stress) between the substrate 50 and layers that will be formed over the undoped semiconductor layer. To effectively perform its function as a buffer layer, the undoped semiconductor layer has reduced dislocation defects and good lattice structure quality. In certain embodiments, the undoped semiconductor layer has a thickness that is in a range from about 1 um to about 5 um.

The epi-layers 60 include an III-V compound layer formed over the undoped semiconductor layer. The III-V compound layer is doped with an n-type dopant, for example Carbon (C) or Silicon (Si). The III-V compound layer includes gallium nitride (GaN) in the present embodiment and may thus be referred to as an n-GaN layer. In some embodiments, the n-GaN layer has a thickness that is in a range from about 2 um to about 6 um.

The epi-layers 60 may include a pre-strained layer formed on the n-GaN layer. The pre-strained layer may be doped with an n-type dopant such as Silicon. In various embodiments, the pre-strained layer may contain a plurality of pairs (for example 20-40 pairs) of interleaving $In_xGa_{1-x}N$ and GaN sub-layers, where x is greater or equal to 0 but less or equal to 1. The pre-strained layer may serve to release strain and reduce a quantum-confined Stark effect (QCSE)—describing the effect of an external electric field upon the light absorption spectrum of a quantum well layer that is formed thereabove. In some embodiments, the pre-strained layer may have an overall thickness in a range from about 30 nanometers (nm) to about 80 nm.

The epi-layers 60 include a multiple-quantum well (MQW) layer formed over the pre-strained layer. The MQW layer includes a plurality of alternating (or interleaving) active and barrier sub-layers. For example, the active sub-layers may include indium gallium nitride ($In_xGa_{1-x}N$), and the barrier sub-layers may include gallium nitride (GaN). In some embodiments, the barrier sub-layers may each have a thickness in a range from about 2 nm to about 5 nm, and the active sub-layers may each have a thickness in a range from about 4 nm to about 17 nm.

The epi-layers 60 may optionally include an electron blocking layer formed over the MQW layer. The electron blocking layer helps confine electron-hole carrier recombination within the MQW layer 80, which may improve quantum efficiency of the MQW layer and reduce radiation in undesired bandwidths. In some embodiments, the electron blocking layer may include a doped $In_xAl_yGa_{1-x-y}N$ material, where x and y are both greater or equal to 0 but less or equal to 1, and the dopant may include a p-type dopant such as Magnesium. The electron blocking layer may have a thickness in a range from about 7 nm to about 25 nm.

The epi-layers 60 include an III-V compound layer formed over the electron blocking layer. The III-V compound layer is doped with a p-type dopant. The III-V compound layer includes gallium nitride (GaN) in the present embodiment and may thus be referred to as a p-GaN layer. In some embodiments, the p-GaN layer has a thickness that is in a range from about 150 nm to about 200 nm.

These epi-layers 60 constitute a core portion of an LED. When an electrical voltage (or electrical charge) is applied to the doped layers (e.g., p-GaN layer and the N-GaN layer) of the LED, the MQW layer emits radiation such as light. The color of the light emitted by the MQW layer corresponds to the wavelength of the radiation. The radiation may be visible, such as blue light, or invisible, such as ultraviolet (UV) light. The wavelength of the light (and hence the color of the light) may be tuned by varying the composition and structure of the materials that make up the MQW layer.

Figure 4:
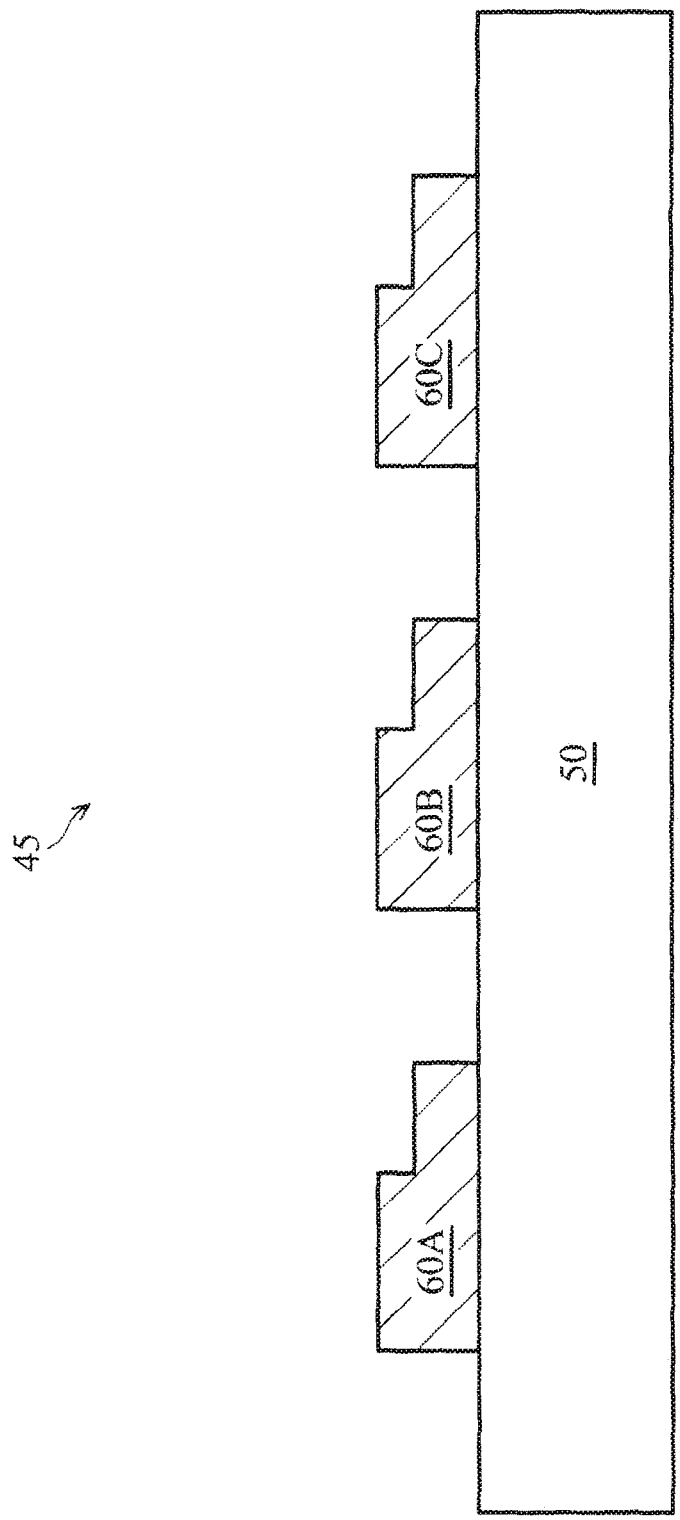

Referring now to FIG. 4, the epi-layers 60 are patterned into a plurality of mesa structures 60A-60C by a lithography process, for example by one or more etching processes. The mesa structures 60A-60C may also be referred to as LEDs or LED chips 60A-60C. The lithography process has been performed such that both the p-GaN layer and the n-GaN layer can be accessed for each LED 60. Also, although not shown in the cross-sectional view of FIG. 4, the top view shapes for the LEDs 60A-60C may be configured flexibly by tuning the lithography process, for example by changing the patterns on the photomask used in the lithography process.

Figure 5:
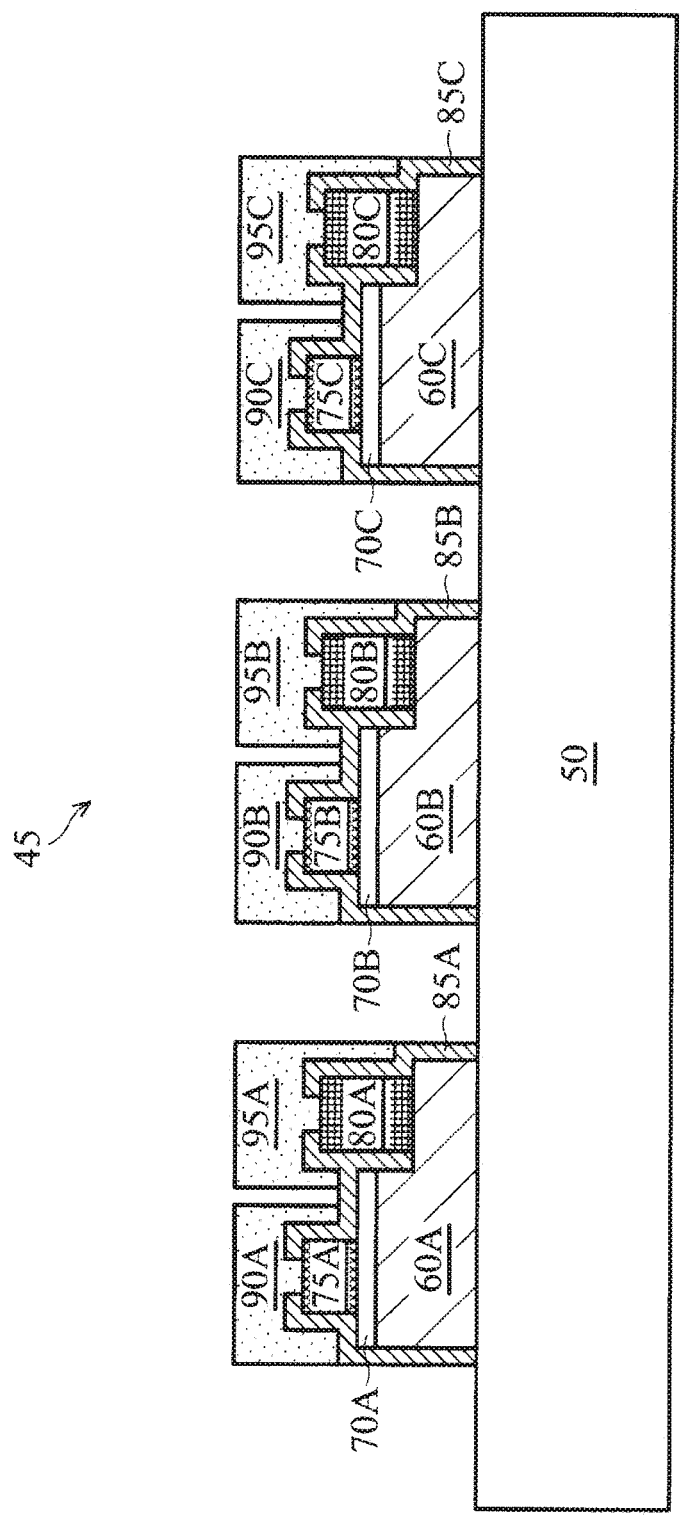

Referring now to FIG. 5, additional elements are formed on the LEDs 60A-60C to prepare the LEDs 60A-60C for bonding with a submount in a bonding process discussed below. These additional elements include (but is not limited to) mirror layers 70, p-type electrodes 75, n-type electrodes 80, passivation layers 85, p-type bonding metals 90, and n-type bonding metals 95.

The mirror layers 70 contain a radiation-reflective material, for example a metal such as aluminum or silver, so as to reflect light emitted by the LED 60 back towards the LED 60.

The p-type electrodes 75 and the n-type electrodes 80 contain electrically conductive materials (such as metal) so as to provide electrical connections to the p-GaN and n-GaN layers of the LED 60, respectively. Although the cross-sectional view in FIG. 5 illustrates a single p-type electrode 75 and a single n-type electrode 80 for each LED 60, it is understood that more than one p-type electrode 75 or more than one n-type electrode 80 may actually be formed on each LED 60.

The passivation layer 85 is configured to protect the exposed surfaces of the LED 60 and the p-type and n-type electrodes 75 and 80 from contaminants such as particles in the air and/or moisture. In some embodiments, the passivation layer 85 contains a dielectric material.

Figure 6:
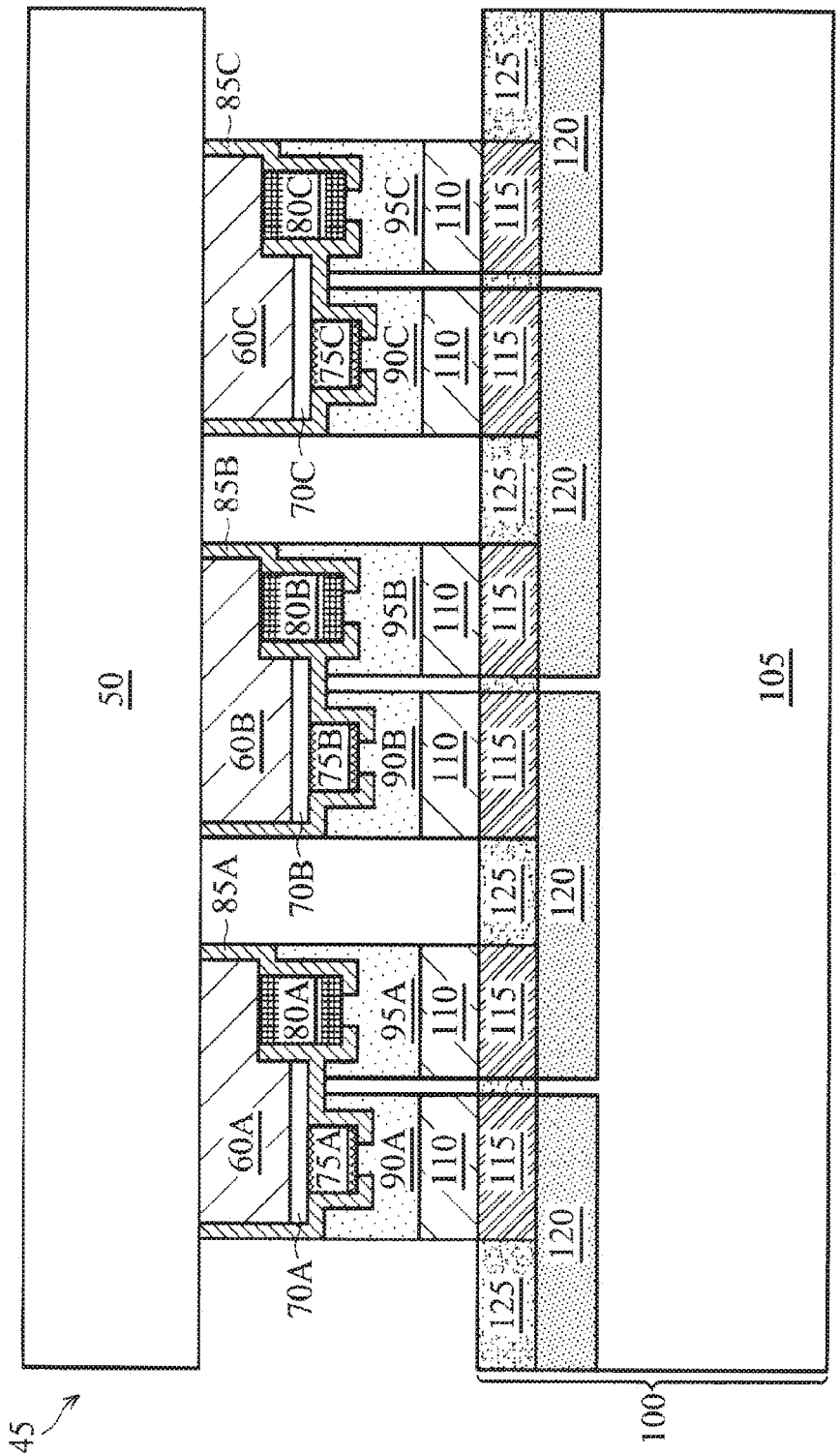

The p-type bonding metals 90 and the n-type bonding metals 95 contain metal materials to facilitate the bonding between the p-type and n-type electrodes 75 and 80 and a submount, which is shown in FIG. 6 and discussed in more detail below.

Referring now to FIG. 6, the die 45 is flipped "upside down" and bonded to a submount 100 in a bonding process. In more detail, the LEDs 60A-60C of the die 45 are bonded to the submount 110 through the solder components 110 in a manner such that the p-type electrodes 75 and n-type electrodes 80 are disposed between the submount 100 and the LEDs 60 (i.e. the epi-layers) after the bonding. The submount 100 includes a submount substrate 105, solder components 110, submount metals 115, circuits 120, and insulation materials 125. In some embodiments, the submount substrate 105 may include a metal-based material, such as copper or aluminum. In other embodiments, the submount substrate 105 may also include a Silicon-on-Insulator (SOI). In alternative embodiments, the submount substrate may also be a silicon substrate, a ceramic substrate, or a metal core printed circuit board (MCPCB) substrate.

The insulation materials 125 may be formed over the submount substrate 100, and the circuits 120 and the submount metals 115 may be formed within the insulation materials so as to provide electrical routing for the LEDs. For example, the circuits 120 may be the metal lines in one or more interconnect layers of an interconnect structure formed over a silicon substrate. As another example, the circuits 120 may be metal traces, such as copper traces, formed over a PCB substrate. In any case, the circuits 120 and the submount metals 115 have been pre-formed on the submount 100 before the bonding process with the LEDs 60 take place. After bonding, it can be seen that the p-GaN and the n-GaN layers of the LEDs are electrically coupled to the circuits 120 via the electrodes 75/80, bonding metals 90/95, the solder components 110, and the submount metals 115.

In some embodiments, such as in the embodiment illustrated in FIG. 6, the LEDs are electrically coupled together in series. That is, the p-GaN layer of one LED 60 is electrically coupled to the n-GaN of an adjacent LED 60, and vice versa. In this manner, a high voltage, for example one that is greater than about 50 to 100 volts (such as 170 volts) can be applied to the LEDs 60 collectively. Due to the electrical coupling in series, each LED 60 need to bear only a portion of the high voltage, for example about 3 to 3.5 volts. Thus, the greater the number of LEDs 60 that are electrically coupled together in series, the greater the voltage they can collectively handle. As such, the die 45 (including the plurality of LEDs 60) is able to function as a high voltage LED (HVLED), for example a voltage as high as 170 volts. Therefore, it may be said that the die 45 has a maximum operational voltage greater than about 170 volts.

It can be seen that the electrical connections between the LEDs 60 are established herein without using bond wires and conductive connection layers formed around each LED. This is advantageous because the use of bond wires and the conductive connection layers would have led to reliability issues. In some cases, the bond wires or the conductive connection layers may be prone to breakage (especially under high current conditions) or peeling. And since the LEDs are electrically coupled together in series, a single failure of a bond wire or a conductive connection layer would have rendered the entire HVLED defective. In comparison, the electrical coupling is done herein via the circuits 120 and the submount metals 115 that were already pre-formed in the submount 100 before bonding. The circuits 120 and the submount metals 115 are more reliable in terms of withstanding adverse conditions and high voltage/current situations and therefore provide a more robust electrical routing scheme for the LEDs 60.

In addition, the die 45 offers improved light extraction efficiency due to its design. In more detail, each of the LEDs is a relatively small mesa structure. For example, the mesa structures have significantly smaller lateral dimensions (widths) in comparison with conventional flip chip LEDs. Whereas flip chip LEDs tend to have current crowding due to its large lateral epi-layer dimensions, the small lateral dimensions for the LED mesa structures herein substantially reduces current crowding. Instead, the electrical current path will utilize substantially all of the epi-layer areas. In turn, the epi-layers (and the MQW layer in particular) will produce more light, thereby increasing the light extraction efficiency of the die 45. To some extent, the LED mesa structures may be sub-divided even further according to various aspects of the present disclosure to further increase the light extraction efficiency of the die 45.

Though not specifically illustrated, it is understood that the bonding of the die 45 to the submount 100 may be performed on a wafer level or on a die level. In a wafer level bonding process, the entire wafer (for example the wafer 40 shown in FIG. 2) on which the die 45 and other similar dies are formed is bonded to the submount 100. Wafer dicing and additional packaging processes may be performed later after the bonding. In a die level bonding process, the wafer may be glued to a tape, the wafer may then be diced so as to separate each die 45 from adjacent dies. Each die is individually bonded to their respective components on the submount (which may still be performed at the same time).

Figure 7:
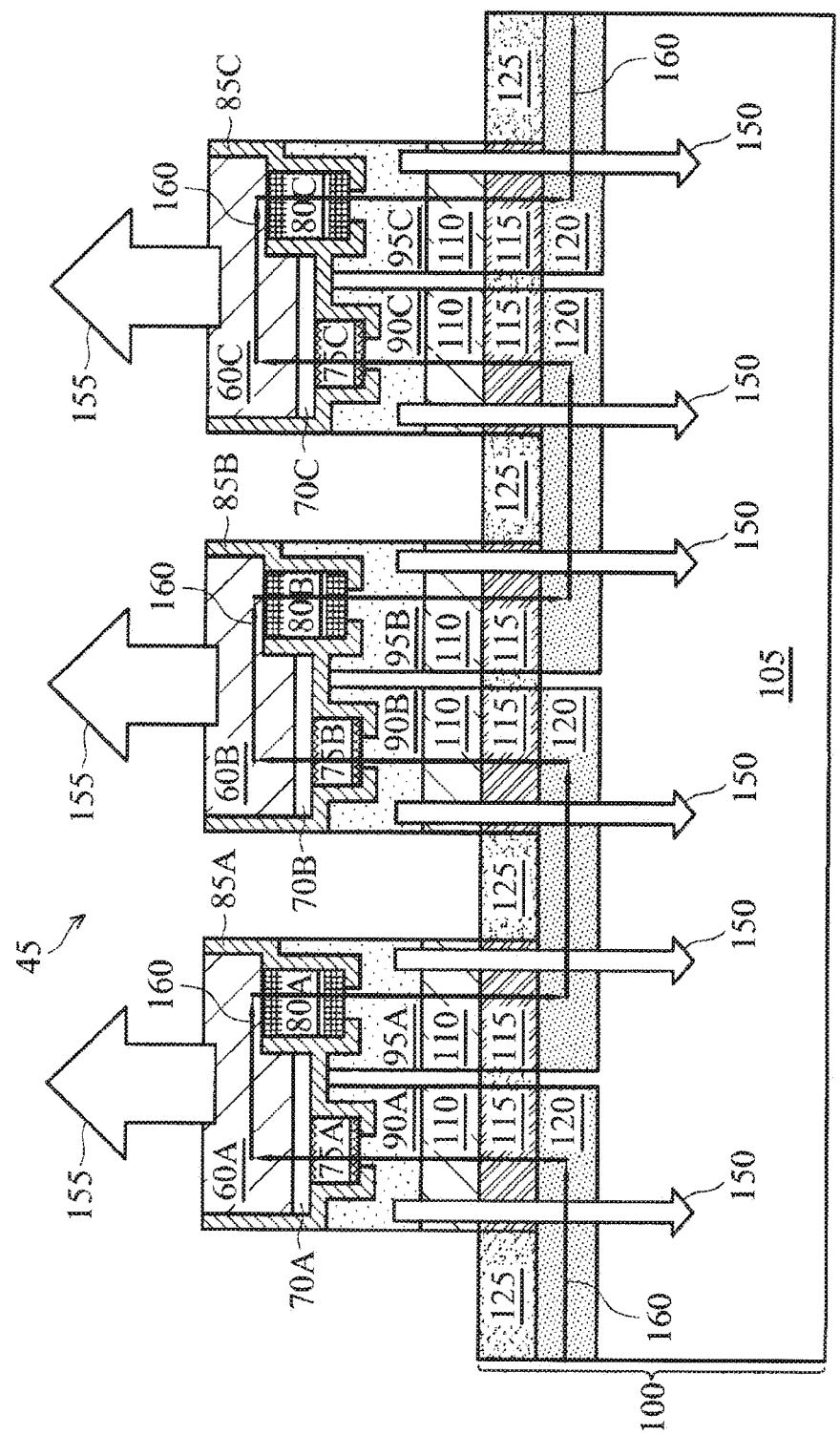

Referring now to FIG. 7, the growth substrate 50 may be removed from the LEDs 60, for example in a laser lift-off process. In some other embodiments, the growth substrate 50 may be thinned down. To better illustrate some of the concepts of the present disclosure, FIG. 7 also shows a heat dissipation path 150, a light propagation path 155, and an electrical conduction path 160 for the die 45.

As is shown by the heat dissipation path 150, the heat generated by the LEDs 60 is dissipated downwardly to the submount 100. The distance between the LEDs 60 and the submount is relatively short, and the submount substrate 105 is relatively thin. Although not shown herein, a heat sink may be disposed below the submount substrate 105. Thus, the heat generated by the LEDs 60 need not propagate far before reaching the submount substrate 105. Furthermore, the various materials along the heat dissipation path 150 have good thermal conductivity, thereby making the heat dissipation even more efficient.

As is shown by the light propagation path 155, the light generated by the LEDs 60 propagates upwardly away from the submount 100. Whatever amount of light that propagates in the downwardly direction is reflected back upwards by the mirror layer 70 and the electrodes 80. Since the light encounters very little obstacles in its intended propagation path, the light output can be good. And as discussed above, the small lateral sizes for the LEDs 60 alleviate the current crowding effect and further improves the light extraction efficiency of the LEDs 60.

As is shown by the electrical conduction path 160, the electrical current flows through the circuits 120, the submount metals 115, the solder components 110, the bonding metals 90 and 95, the electrodes 75 and 80, and the epi-layers 60 (i.e., the LEDs). In this manner, the LEDs are electrically coupled together in series without using bond wires or conduction layers (used for conventional HVLEDs), thereby making the electrical conduction for the die 45 more reliable and robust. It is understood that in some embodiments, not all the LEDs need to be electrically coupled in series. Instead, only the LEDs in a selected subset are electrically coupled in series in some embodiments.

Figure 8:
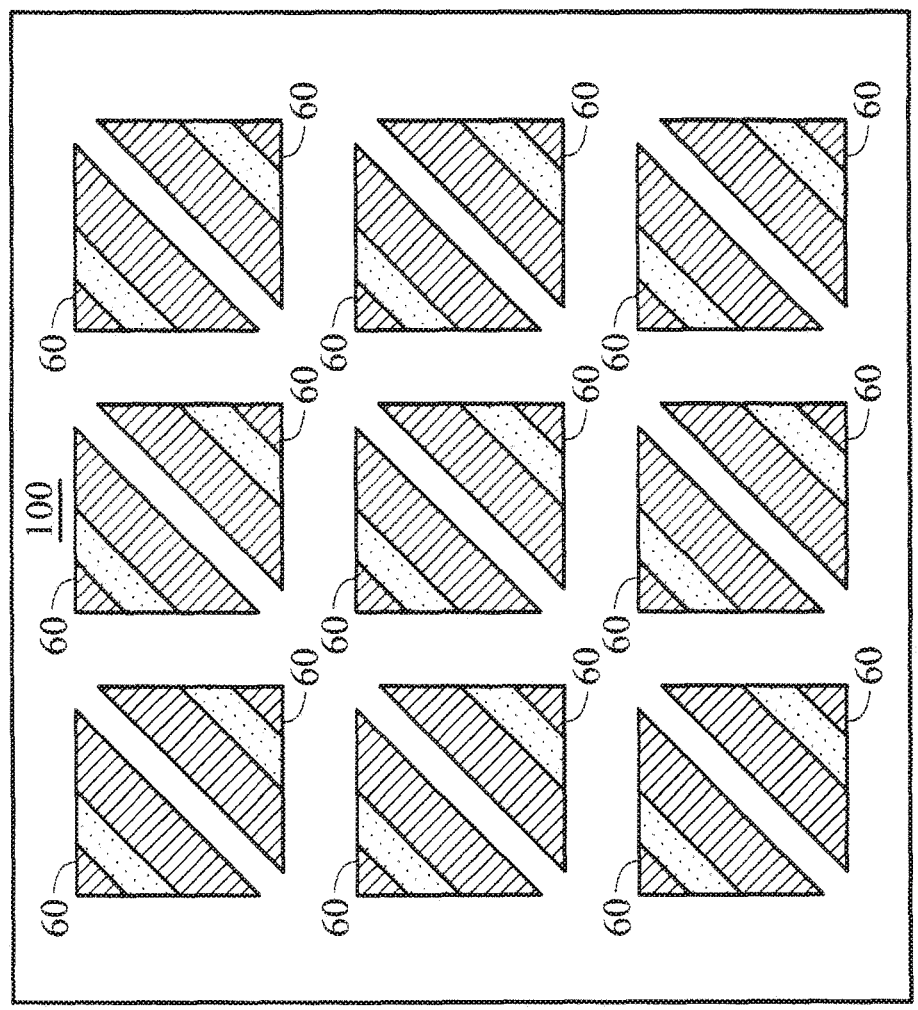
FIG. 8 is a diagrammatic top view of an example die containing a plurality of LEDs according to various aspects of the present disclosure.

FIG. 8 shows a simplified diagrammatic top view of the die 45 according to some embodiments of the present disclosure. In the embodiment shown in FIG. 8, the die 45 includes 18 LEDs (or LED chips) 60. Each of the LEDs 60 may resemble the LEDs 60A-60C discussed above and may be fabricated according to the same processes. The LEDs 60 are bonded to the submount 100 that includes the submount substrate 105 shown in FIGS. 6-7. The LEDs 60 (or a subset thereof) are electrically coupled together in series using conductive components such as the circuits 120 in the submount 100, which may include metal lines in interconnect layers or copper traces on a PCB, as examples.

As shown in the top view of FIG. 8, each of the LEDs 60 has a substantially triangular shape or pattern. It may be said that the LEDs 60 are arranged in pairs. The LED in each pair is located closer to its closest adjacent LED (i.e., its pair member) than it is to other adjacent LEDs. Each pair of adjacent LEDs 60 collectively form a top view pattern resembling a rectangle or a square. However, this arrangement is shown only as an example, and the LEDs may take on any shape or geometry in other embodiments, and the same is true for the top view patterns of the die 45.

Figure 9:
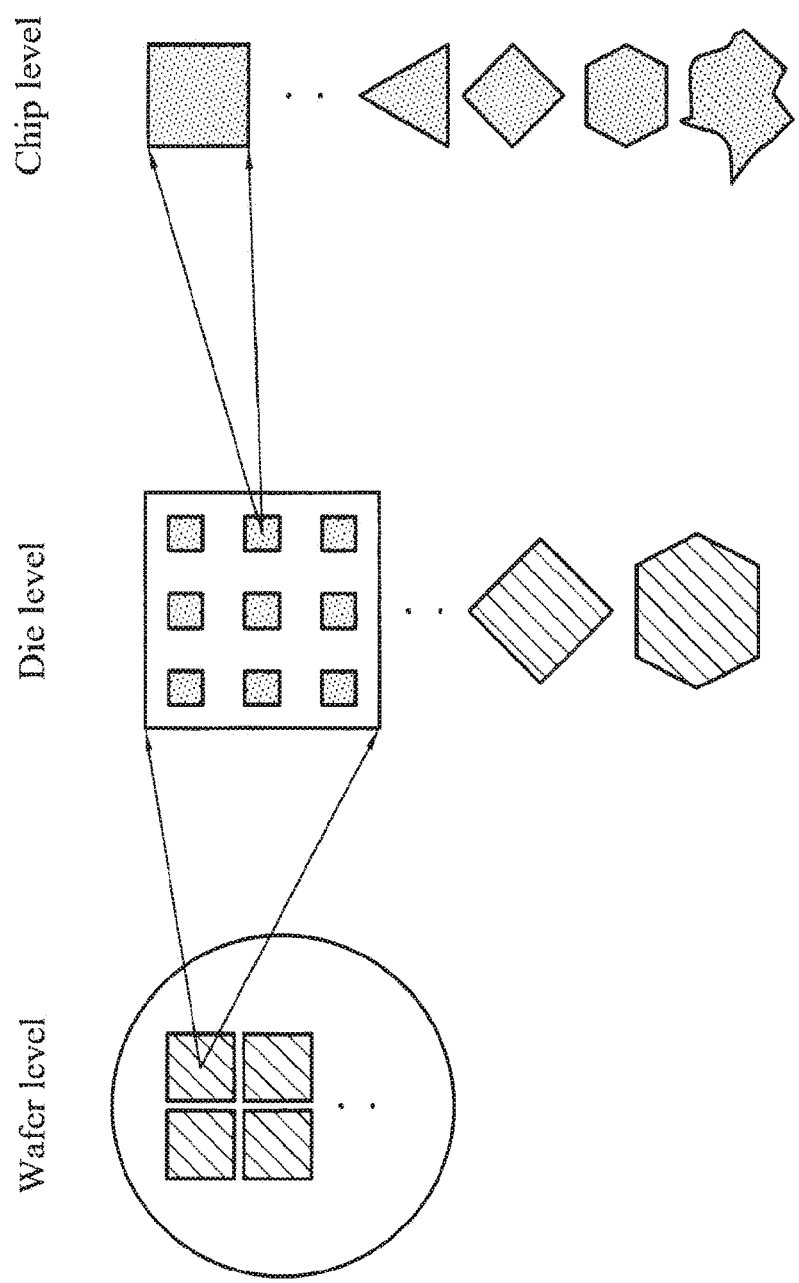
FIG. 9 are diagrammatic top views of example shapes for a wafer including a plurality of dies, one of the plurality of dies including a plurality of LEDs, and one of the plurality of the LEDs.

To better illustrate the above concept, FIG. 9 shows the various top views according to different embodiments of the present disclosure in a wafer level, a die level, and a chip level. As can be seen, at the wafer level top view, the wafer includes a plurality of HVLED dies, each of which may be similar to the die 45 discussed above. At the die level, each of the HVLED dies may include a plurality of LEDs (or LED chips). In the top view, each HVLED die may take on a rectangular shape, a square shape, a diamond shape, a hexagonal shape, or any other suitable polygonal shape that can be accommodated by dicing techniques now known or developed later.

At the chip level (i.e., LED level), in the top view, each of the LEDs may take on a rectangular shape, a square shape, a diamond shape, a triangular shape, a hexagonal shape, any other suitable polygonal shape, or even an irregular shape having one or more curved sides or edges. The LEDs of the present disclosure offers such versatile top view shapes due to the fact that the LEDs are patterned through lithography processes, which can be adjusted (for example by changing the patterns on a photomask) to achieve any desired top view shape for each of the LEDs.

In addition to the top view shape flexibility, the LED dies may each take on a different top view shape than the rest of the LED dies. For example, within a single die, one LED may have a triangular top view shape, another LED may have a rectangular top view shape, yet another LED may have a hexagonal top view shape, and yet another LED may have an irregular top view shape with at least one non-straight side/edge. The LEDs may be configured to produce any arrangement of top view shapes depending on design requirements and manufacturing concerns. The flexibility and versatility of the shapes of the LEDs or LED chips may confer benefits such as increased light extraction efficiency, better thermal dissipation, etc.

To complete the fabrication of the HVLED die 45, additional processes such as dicing, packaging, and testing processes may also be performed, but they are not illustrated herein for the sake of simplicity.

Figure 10:
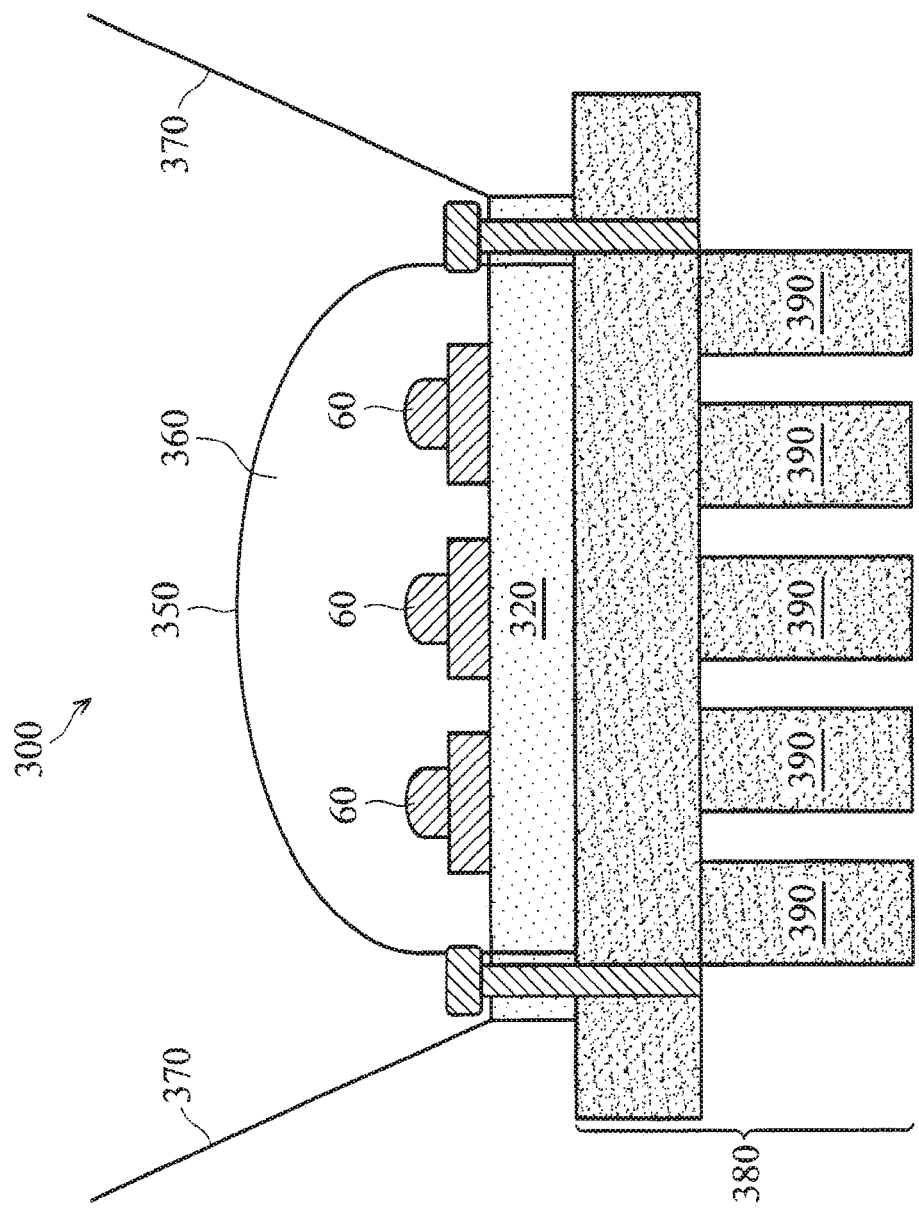
FIG. 10 is a diagrammatic cross-sectional side view of a lighting module that includes the die of FIGS. 3-7 according to various aspects of the present disclosure.

The HVLED die 45 can be implemented as a part of a lighting apparatus. For example, the HVLED die 45 may be implemented as a part of a LED-based lighting instrument 300, a simplified cross-sectional view of which is shown in FIG. 10. The embodiment of the LED-based lighting instrument 300 shown in FIG. 10 includes a plurality of LEDs 60 of the HVLED die 45, where the LEDs (or a selected subset thereof) are electrically coupled together in series. Though only three of such LEDs 60 are shown in the embodiment shown in FIG. 10, it is understood that any other number of LEDs may be implemented so that the HVLED die can withstand a high voltage, for example a voltage as high as 170 volts.

As discussed above, the LEDs 60 each include an n-doped III-V group compound layer, a p-doped III-V group compound layer, and a MQW layer disposed between the n-doped and p-doped III-V compound layers. Due to the configuration of the LEDs 60 discussed above, the LEDs 60 of the HVLED herein offer better heat dissipation, light extraction, and electrical conduction reliability performances compared to traditional LEDs.

In some embodiments, the LEDs 60 each have a phosphor layer coated thereon. The phosphor layer may include either phosphorescent materials and/or fluorescent materials. The phosphor layer may be coated on the surfaces of the LEDs 60 in a concentrated viscous fluid medium (e.g., liquid glue). As the viscous liquid sets or cures, the phosphor material becomes a part of the LED package. In practical LED applications, the phosphor layer may be used to transform the color of the light emitted by an LED 60. For example, the phosphor layer can transform a blue light emitted by an LED 60 into a different wavelength light. By changing the material composition of the phosphor layer, the desired light color emitted by the LED 60 may be achieved.

The LEDs 60 are mounted on a submount 320. In some embodiments, the submount 320 is similar to the submount 100 discussed above. For example, the submount 320 may include a Metal Core Printed Circuit Board (MCPCB). The MCPCB includes a metal base that may be made of aluminum (or an alloy thereof). The MCPCB also includes a thermally conductive but electrically insulating dielectric layer disposed on the metal base. The MCPCB may also include a thin metal layer made of copper that is disposed on the dielectric layer. In alternative embodiments, the submount 320 may include other suitable thermally conductive structures such as silicon submounts or ceramic submounts.

The lighting instrument 300 includes a diffuser cap 350. The diffuser cap 350 provides a cover for the LEDs 60 therebelow. Stated differently, the LEDs 60 are encapsulated by the diffuser cap 350 and the substrate 320 collectively. In some embodiments, the diffuser cap 350 has a curved surface or profile. In some embodiments, the curved surface may substantially follow the contours of a semicircle, so that each beam of light emitted by the LEDs 60 may reach the surface of the diffuser cap 350 at a substantially right incident angle, for example, within a few degrees of 90 degrees. The curved shape of the diffuser cap 350 helps reduce Total Internal Reflection (TIR) of the light emitted by the LEDs 60.

The diffuser cap 350 may have a textured surface. For example, the textured surface may be roughened, or may contain a plurality of small patterns such as polygons or circles. Such textured surface helps scatter the light emitted by the LEDs 60 so as to make the light distribution more uniform. In some embodiments, the diffuser cap 350 is coated with a diffuser layer containing diffuser particles.

In some embodiments, a space 360 between the LEDs 60 and the diffuser cap 350 is filled by air. In other embodiments, the space 360 may be filled by an optical-grade silicone-based adhesive material, also referred to as an optical gel. Phosphor particles may be mixed within the optical gel in that embodiment so as to further diffuse light emitted by the LEDs 60.

Though the illustrated embodiment shows all of the LEDs 60 being encapsulated within a single diffuser cap 350, it is understood that a plurality of diffuser caps may be used in other embodiments. For example, each of the LEDs 60 may be encapsulated within a respective one of the plurality of diffuser caps.

The lighting instrument 300 may also optionally include a reflective structure 370. The reflective structure 370 may be mounted on the substrate 320. In some embodiments, the reflective structure is shaped like a cup, and thus it may also be referred to as a reflector cup. The reflective structure encircles or surrounds the LEDs 60 and the diffuser cap 350 in 360 degrees from a top view. From the top view, the reflective structure 370 may have a circular profile, a beehive-like hexagonal profile, or another suitable cellular profile encircling the diffuser cap 350. In some embodiments, the LEDs 60 and the diffuser cap 350 are situated near a bottom portion of the reflective structure 370. Alternatively stated, the top or upper opening of the reflective structure 370 is located above or over the LEDs 60 and the diffuser cap 350.

The reflective structure 370 is operable to reflect light that propagates out of the diffuser cap 350. In some embodiments, the inner surface of reflective structure 370 is coated with a reflective film, such as aluminum, silver, or alloys thereof. It is understood that the surface of the sidewalls of the reflective structure 370 may be textured in some embodiments, in a manner similar to the textured surface of the diffuser cap 350. Hence, the reflective structure 370 is operable to perform further scattering of the light emitted by the LEDs 60, which reduces glare of the light output of the lighting instrument 300 and makes the light output friendlier to the human eye. In some embodiments, the sidewalls of the reflective structure 370 have a sloped or tapered profile. The tapered profile of the reflective structure 370 enhances the light reflection efficiency of the reflective structure 370.

The lighting instrument 300 includes a thermal dissipation structure 380, also referred to as a heat sink 380. The heat sink 380 is thermally coupled to the LEDs 60 (which generate heat during operation) through the substrate 320. In other words, the heat sink 380 is attached to the substrate 320, or the substrate 320 is located on a surface of the heat sink 380. The heat sink 380 is configured to facilitate heat dissipation to the ambient atmosphere. The heat sink 380 contains a thermally conductive material, such as a metal material. The shape and geometries of the heat sink 380 are designed to provide a framework for a familiar light bulb while at the same time spreading or directing heat away from the LEDs 60. To enhance heat transfer, the heat sink 380 may have a plurality of fins 390 that protrude outwardly from a body of the heat sink 380. The fins 390 may have substantial surface area exposed to ambient atmosphere to facilitate heat transfer.

Figure 11:
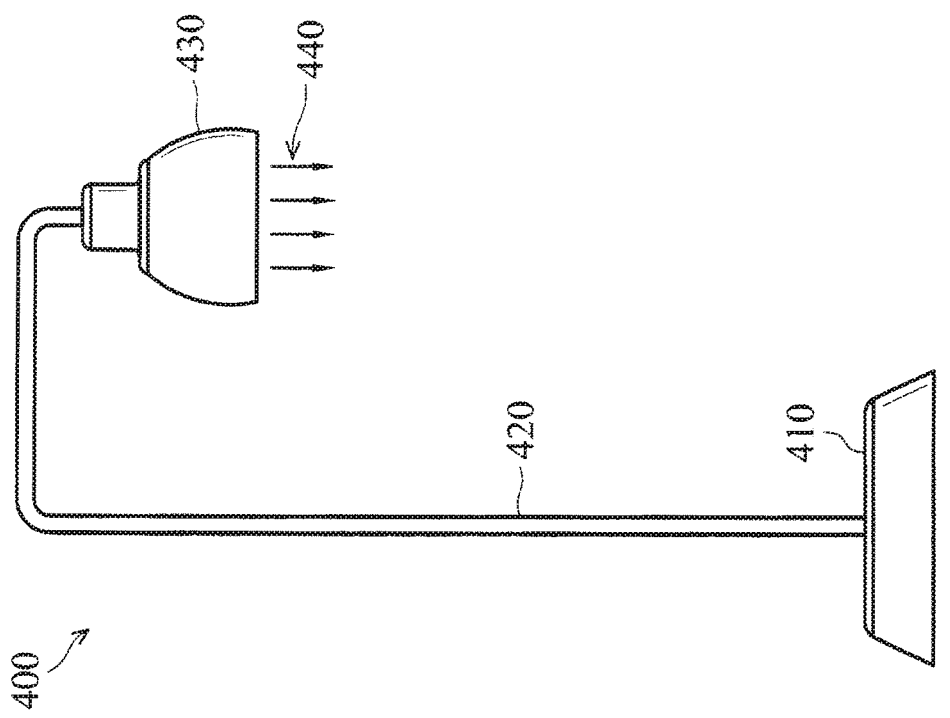
FIG. 11 is a diagrammatic view of a lighting module that includes the LED lighting apparatus of FIG. 10 according to various aspects of the present disclosure.

FIG. 11 illustrates a simplified diagrammatic view of a lighting module 400 that includes some embodiments of the lighting instrument 300 discussed above. The lighting module 400 has a base 410, a body 420 attached to the base 410, and a lamp 430 attached to the body 420. In some embodiments, the lamp 430 is a down lamp (or a down light lighting module). The lamp 430 includes the lighting instrument 300 discussed above with reference to FIG. 10. The lamp 430 is operable to efficiently project light beams 440. In addition, the lamp 430 can offer greater durability and longer lifetime compared to traditional incandescent lamps. It is understood that other lighting applications may benefit from using the LEDs of the present disclosure discussed above. For example, the LEDs of the present disclosure may be used in lighting applications including, but not limited to, vehicle headlights or taillights, vehicle instrument panel displays, light sources of projectors, light sources of electronics such as Liquid Crystal Display (LCD) televisions or LCD monitors, tablet computers, mobile telephones, or notebook/laptop computers.

Figure 12:
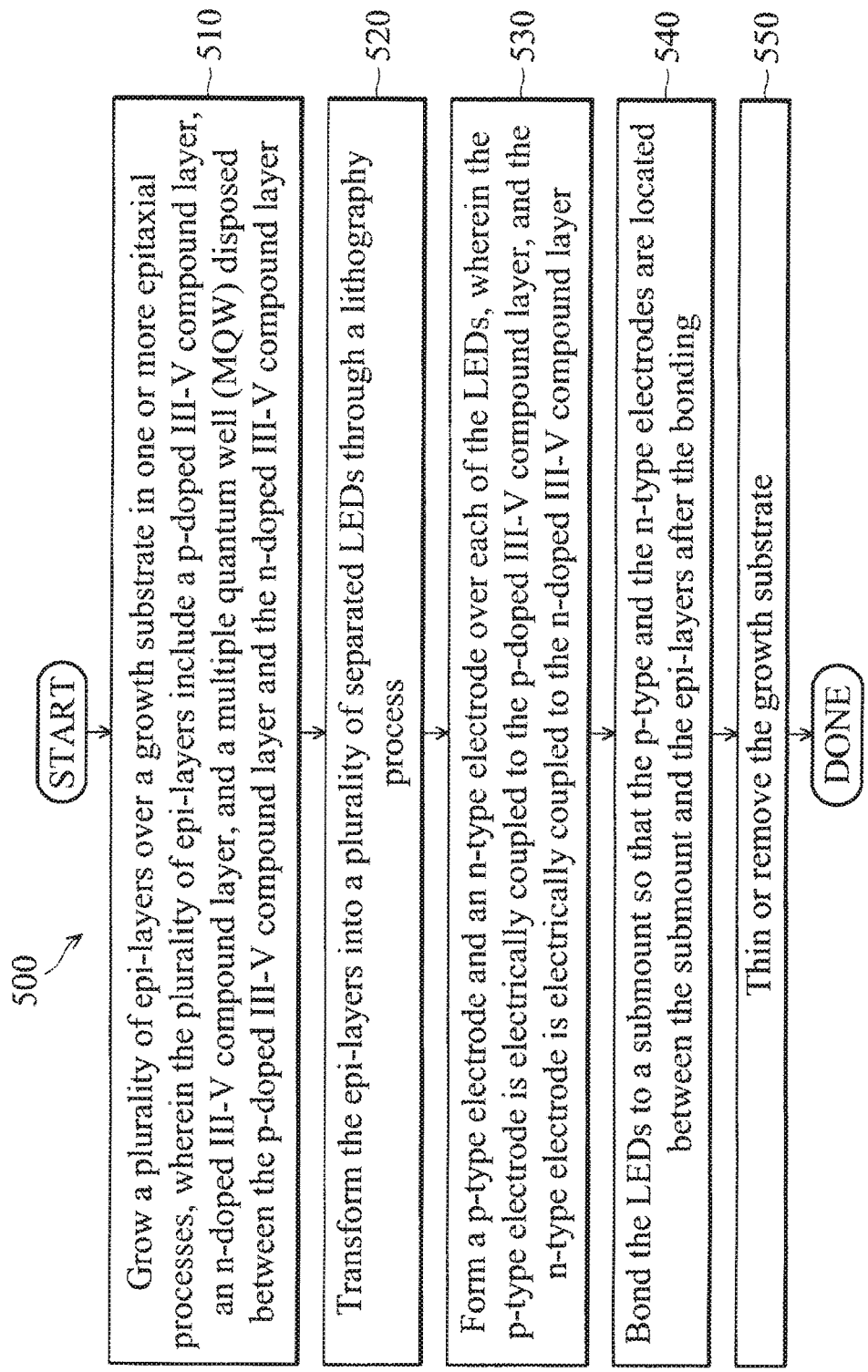
FIG. 12 is a flowchart illustrating a method of fabricating a high voltage LED lighting apparatus according to various aspects of the present disclosure.

FIG. 12 is a flowchart illustrating a simplified method 500 of fabricating a high voltage light-emitting diode (HVLED) apparatus according to the various aspects of the present disclosure. The HVLED apparatus may include one or more dies that each includes a plurality of LEDs.

The method 500 includes a step 510, in which a plurality of epi-layers is grown over a growth substrate in one or more epitaxial processes. In some embodiments, the growth substrate includes a sapphire material. The plurality of epi-layers includes a p-doped III-V compound layer, an n-doped III-V compound layer, and a multiple quantum well (MQW) disposed between the p-doped III-V compound layer and the n-doped III-V compound layer.

The method 500 includes a step 520, in which the epi-layers is transformed into a plurality of separated LEDs through a lithography process. The plurality of separated LEDs is parts of a polygonal die. In some embodiments, the transforming process in step 520 is performed so that at least one of the following is true: at least some of the LEDs have different shapes than a rest of the LEDs in a top view; at least some of the LEDs have non-rectangular polygonal shapes in a top view; and at least some of the LEDs have one or more curved sides in a top view.

The method 500 includes a step 530, in which a p-type electrode and an n-type electrode are formed over each of the LEDs. The p-type electrode is electrically coupled to the p-doped III-V compound layer, and the n-type electrode is electrically coupled to the n-doped III-V compound layer.

The method 500 includes a step 540, in which the LEDs are bonded to a submount so that the p-type and the n-type electrodes are located between the submount and the epi-layers after the bonding. In some embodiments, the submount includes one of: a metal-based material, a silicon-on-insulator material, a silicon submount, a ceramic submount, or a metal core printed circuit board (MCPCB) submount. In some embodiments, the submount contains a plurality of conductive elements. In some embodiments, the bonding process in step 540 is performed so that at least a subset of the LEDs is electrically coupled in series by the conductive elements. In some embodiments, the bonding process in step 540 includes a wafer level bonding process. In some other embodiments, the bonding process in step 540 includes a die level bonding process.

The method 500 includes a step 550, in which the growth substrate is thinned or removed after the bonding in step 540.

Additional processes may be performed before, during, or after the blocks 510-540 discussed herein to complete the fabrication of the photonic device. These other processes are not discussed in detail herein for reasons of simplicity.

One aspect the present disclosure involves a lighting apparatus. The lighting apparatus includes: a polygon die including a plurality of light-emitting diodes (LEDs), and wherein each LED includes: a plurality of epi-layers, the epi-layers containing a p-type layer, an n-type layer, and a multiple quantum well (MQW) disposed between the p-type layer and the n-type layer; and a p-type electrode and an n-type electrode electrically coupled to the p-type layer and the n-type layer, respectively. The lighting apparatus also includes a submount to which each of the LEDs is coupled, wherein the p-type and the n-type electrodes are located between the submount and the epi-layers, wherein the submount contains a plurality of conductive elements configured to electrically couple at least a portion of the plurality of LEDs in series, and wherein at least some of the plurality of LEDs have non-rectangular top view shapes.

In some embodiments, at least some of the LEDs have different top view shapes than a rest of the LEDs.

In some embodiments, at least some of the LEDs have non-rectangular polygonal top view shapes.

In some embodiments, at least some of the LEDs have some curved sides in a top view.

In some embodiments, a first distance separating a first subset of adjacent LEDs is greater than a second distance separating a second subset of adjacent LEDs.

In some embodiments, the lighting apparatus includes a plurality of polygon dies.

In some embodiments, the submount includes one of: a metal-based material, a silicon-on-insulator material, a silicon submount, a ceramic submount, or a metal core printed circuit board (MCPCB) submount. In some embodiments, at least some of the conductive elements include: metal lines of an interconnect layer formed over the silicon submount, or metal traces formed over the MCPCB submount.

In some embodiments, the plurality of LEDs include an X number of LEDs, wherein the number X is selected so that the X number of LEDs, when electrically coupled together in series, has a maximum operational voltage greater than about 170 volts.

One aspect the present disclosure involves a lighting apparatus. The lighting apparatus includes: a die including a plurality of light-emitting diodes (LEDs), and wherein each LED includes: a plurality of epi-layers, the epi-layers containing a p-doped III-V compound layer, an n-doped III-V compound layer, and a multiple quantum well (MQW) disposed between the p-doped III-V compound layer and the n-doped III-V compound layer; and a first electrode and a second electrode electrically coupled to the p-doped III-V compound layer and the n-doped III-V compound layer, respectively. The lighting apparatus also includes a submount bonded to the die, wherein the first and second electrodes are located between the submount and the epi-layers; wherein at least one of the following is true: some of the LEDs have different patterns than other LEDs in a top view; some of the LEDs have non-rectangular polygonal patterns in a top view; and some of the LEDs have one or more curved edges in a top view.

In some embodiments, the submount contains a plurality of conductive elements configured to electrically couple together at least a subset of the plurality of LEDs in series.

In some embodiments, the lighting apparatus includes a plurality of polygonal dies, said die being one of the polygonal dies.

In some embodiments, the submount includes one of: a metal-based material, a silicon-on-insulator material, a silicon submount, a ceramic submount, or a metal core printed circuit board (MCPCB) submount. In some embodiments, at least some of the conductive elements include: metal lines of an interconnect layer formed over the silicon submount, or metal traces formed over the MCPCB submount.

Yet another aspect of the present disclosure involves a method of fabricating a high voltage light-emitting diode apparatus. The method includes: growing a plurality of epi-layers over a growth substrate in one or more epitaxial processes, wherein the plurality of epi-layers include a p-doped III-V compound layer, an n-doped III-V compound layer, and a multiple quantum well (MQW) disposed between the p-doped III-V compound layer and the n-doped III-V compound layer; removing a portion of the epi-layers over the growth substrate to form streets between separated LEDs by etching according to a lithography pattern, said pattern including non-rectangular LEDs; forming a p-type electrode and an n-type electrode over each of the LEDs, wherein the p-type electrode is electrically coupled to the p-doped III-V compound layer, and the n-type electrode is electrically coupled to the n-doped III-V compound layer; bonding the LEDs to a submount so that the p-type and the n-type electrodes are located between the submount and the epi-layers after the bonding; and thereafter thinning or removing the growth substrate.

In some embodiments, the transforming the epi-layers into the plurality of separated LEDs is performed so that at least one of the following is true: at least some of the LEDs have different shapes than a rest of the LEDs in a top view; at least some of the LEDs have non-rectangular polygonal shapes in a top view; and at least some of the LEDs have one or more curved sides in a top view.

In some embodiments, the growth substrate includes a sapphire material; the submount includes one of: a metal-based material, a silicon-on-insulator material, a silicon submount, a ceramic submount, or a metal core printed circuit board (MCPCB) submount; the submount contains a plurality of conductive elements; and the bonding is performed so that at least a subset of the LEDs are electrically coupled in series by the conductive elements.

In some embodiments, the plurality of separated LEDs is parts of a polygonal die.

In some embodiments, the bonding comprises a wafer level bonding process.

In some embodiments, the bonding comprises a die level bonding process.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A light-emitting device, comprising:
    a substrate;
    a first mesa structure having a first side facing the substrate, a second side opposite to the first side, p-type electrode and an n-type electrode arranged on the first side;
    a passivation layer formed on the first mesa structure and exposing the p-type electrode and the n-type electrode;
    a plurality of bonding metals formed on the p-type electrode, the n-type electrode and the passivation layer; and
    a second mesa structure adjacent to the first mesa structure on the substrate;
    wherein the first mesa structure and the second mesa structure have same shapes with different orientations, or different shapes, in a top view, and
    wherein the first mesa structure and the second mesa structure collectively have a pattern different from the shapes of the first mesa structure and the second mesa structure in the top view.

2. The light-emitting device of claim 1, wherein the first mesa structure and the second mesa structure have triangular shapes.

3. The light-emitting device of claim 1, wherein the first mesa structure and the second mesa structure collectively have a rectangular or square pattern.

4. The light-emitting device of claim 1, wherein the first mesa structure and the second mesa structure are configured to not electrically connected in series before bonding to a submount.

5. The light-emitting device of claim 1, wherein the substrate has an outline similar to the pattern.

6. The light-emitting device of claim 1, wherein the substrate is a thin-down substrate.

7. The light-emitting device of claim 1, further comprising a third mesa structure arranged on the substrate, wherein the first mesa structure is nearer the second mesa structure than the third mesa structure.

8. The light-emitting device of claim 1, wherein the first mesa structure and the second mesa structure have different non-rectangular shapes.

9. A light-emitting device, comprising:
    a substrate;
    a first mesa structure arranged on the substrate, and having a first p-type electrode, a first n-type electrode and a first shape; and
    a second mesa structure electrically separated from the first mesa structure on the substrate, and having a second p-type electrode, a second n-type electrode and a second shape;
    wherein the first shape and the second shape collectively form a pattern which is different from the first shape or the second shape, and
    wherein the first mesa structure and the second mesa structure are electrically disconnected to each other before bonding to a submount.

10. The light-emitting device of claim 9, wherein the substrate is a thin-down substrate.

11. The light-emitting device of claim 9, wherein the substrate is a growth substrate.

12. The light-emitting device of claim 9, wherein the first mesa structure has a first edge, the second mesa structure has a second edge substantially parallel to the second edge.

13. The light-emitting device of claim 9, wherein the first mesa structure has a first edge, the second mesa structure has a second edge, the first edge and the second edge have similar lengths.

14. The light-emitting device of claim 9, wherein the substrate has an outline similar to the pattern.

15. A light-emitting device, comprising:
    a substrate;
    a first mesa structure arranged on the substrate and having a p-type electrode and an n-type electrode;
    a second mesa structure electrically separated from the first mesa structure on the substrate; and
    a passivation layer formed on the first mesa structure and the second mesa structure;
    wherein the passivation layer and the substrate are arranged on different sides of the first mesa structure, and
    wherein the substrate, the first mesa structure, and the second mesa structure have different shapes in a top view.

16. The light-emitting device of claim 15, wherein the substrate is a thin-down substrate.

17. The light-emitting device of claim 15, wherein the substrate is a growth substrate.

18. The light-emitting device of claim 15, wherein the first mesa structure and the second mesa structure collectively have a pattern different to the shapes of the first mesa structure and the second mesa structure.

19. The light-emitting device of claim 15, further comprising a third mesa structure, wherein the first mesa structure, the second mesa structure, and the third mesa structure collectively have a pattern different from either one shape of the first mesa structure, the second mesa structure, and the third mesa structure.

20. The light-emitting device of claim 15, wherein the first mesa structure and the second mesa structure are arranged in a pair.

\* \* \* \* \*